US010233561B2

United States Patent
Lee et al.

(10) Patent No.: US 10,233,561 B2
(45) Date of Patent: Mar. 19, 2019

(54) ELECTROSTATIC LEVITATION CRYSTAL GROWTH APPARATUS COMPRISING A DROPLET DISPENSER

(71) Applicant: KOREA RESEARCH INSTITUTE OF STANDARDS AND SCIENCE, Daejeon (KR)

(72) Inventors: Geun-Woo Lee, Daejeon (KR); Soo Heyong Lee, Seoul (KR)

(73) Assignee: Korea Research Institute of Standards and Science, Daejeon (KR)

( * ) Notice: Subject to any disclaimer, the term of this patent is extended or adjusted under 35 U.S.C. 154(b) by 153 days.

(21) Appl. No.: 15/246,980

(22) Filed: Aug. 25, 2016

(65) Prior Publication Data
US 2016/0362811 A1 Dec. 15, 2016

Related U.S. Application Data

(63) Continuation of application No. PCT/KR2015/001122, filed on Feb. 4, 2015.

(30) Foreign Application Priority Data

Feb. 28, 2014 (KR) ........................ 10-2014-0023883

(51) Int. Cl.
| | |
|---|---|
| *C30B 7/02* | (2006.01) |
| *C30B 30/02* | (2006.01) |
| *C30B 30/08* | (2006.01) |
| *B23K 26/70* | (2014.01) |
| *B01D 1/00* | (2006.01) |

(52) U.S. Cl.
CPC .............. *C30B 7/02* (2013.01); *B01D 1/0029* (2013.01); *B01D 1/0082* (2013.01); *B23K 26/70* (2015.10); *C30B 30/02* (2013.01); *C30B 30/08* (2013.01)

(58) Field of Classification Search
CPC .... C30B 7/00; C30B 7/02; C30B 7/04; C30B 7/06; C30B 7/08; C30B 7/10; C30B 9/00;
(Continued)

(56) References Cited

U.S. PATENT DOCUMENTS

| | | | | |
|---|---|---|---|---|
| 5,303,117 | A * | 4/1994 | Ogihara | ................. H02N 13/00 117/206 |
| 5,558,837 | A * | 9/1996 | Tsukishima | ............. B01L 99/00 222/195 |
| 2009/0076294 | A1 | 3/2009 | Agnes et al. | |
| 2011/0214982 | A1 * | 9/2011 | Hagen | .................. B01J 19/0093 204/157.15 |

FOREIGN PATENT DOCUMENTS

| | | |
|---|---|---|
| JP | 2001-002500 | 1/2001 |
| KR | 10-1203877 | 11/2012 |
| KR | 10-2013-0119594 | 11/2013 |

OTHER PUBLICATIONS

T. Hilger et al., "Controlling Charge on Levitating Drops," Analytical Chemistry, 2007, vol. 79, No. 15, pp. 6027-6030.
(Continued)

*Primary Examiner* — Kenneth A Bratland, Jr.
(74) *Attorney, Agent, or Firm* — Jenkins, Wilson, Taylor & Hunt, P.A.

(57) ABSTRACT

An electrostatic levitation crystal growth apparatus for a solution and a crystal growing method using the same. The apparatus may include an upper electrode, a lower electrode vertically spaced apart from the upper electrode, a power supply unit configured to apply a vertical electrostatic field between the upper electrode and the lower electrode, and a droplet dispenser configured to eject a solution into a region between the upper and lower electrodes and thereby to form a solution droplet. The solution droplet may be maintained in a charged state and may be electrostatically levitated against the gravity exerted thereon, by the vertical electrostatic field. The solution droplet may be evaporated in the electrostatically levitated state, and a solute dissolved in the solution may be grown to form a crystal.

13 Claims, 12 Drawing Sheets

(58) Field of Classification Search
CPC .. C30B 9/02; C30B 9/04; C30B 29/00; C30B 29/10; C30B 29/12; C30B 29/14; C30B 30/00; C30B 30/02; C30B 30/08; B23K 26/70; B01D 1/0029; B01D 1/0082; Y10T 117/00; Y10T 117/10; Y10T 117/1004; Y10T 117/1008; Y10T 117/1012; Y10T 117/1016; Y10T 117/1024; Y10T 117/1096
USPC ........ 117/10, 68–71, 77, 200–206, 224, 901, 117/937, 940–941
See application file for complete search history.

(56) References Cited

OTHER PUBLICATIONS

Neil D. Draper et al., "Ion-InducedNucleation in Solution: Promotion of solute Nucleation in Charged Levitated Droplets," Journal to the American Chemical Society, 2007, vol. 129, No. 37, pp. 11364-11377.
International Search Report for Application No. PCT/KR2015/001122 dated May 7, 2015.
IPRP and Written Opinion for Application No. PCT/KR2015/001122 dated Sep. 6, 2016.

* cited by examiner

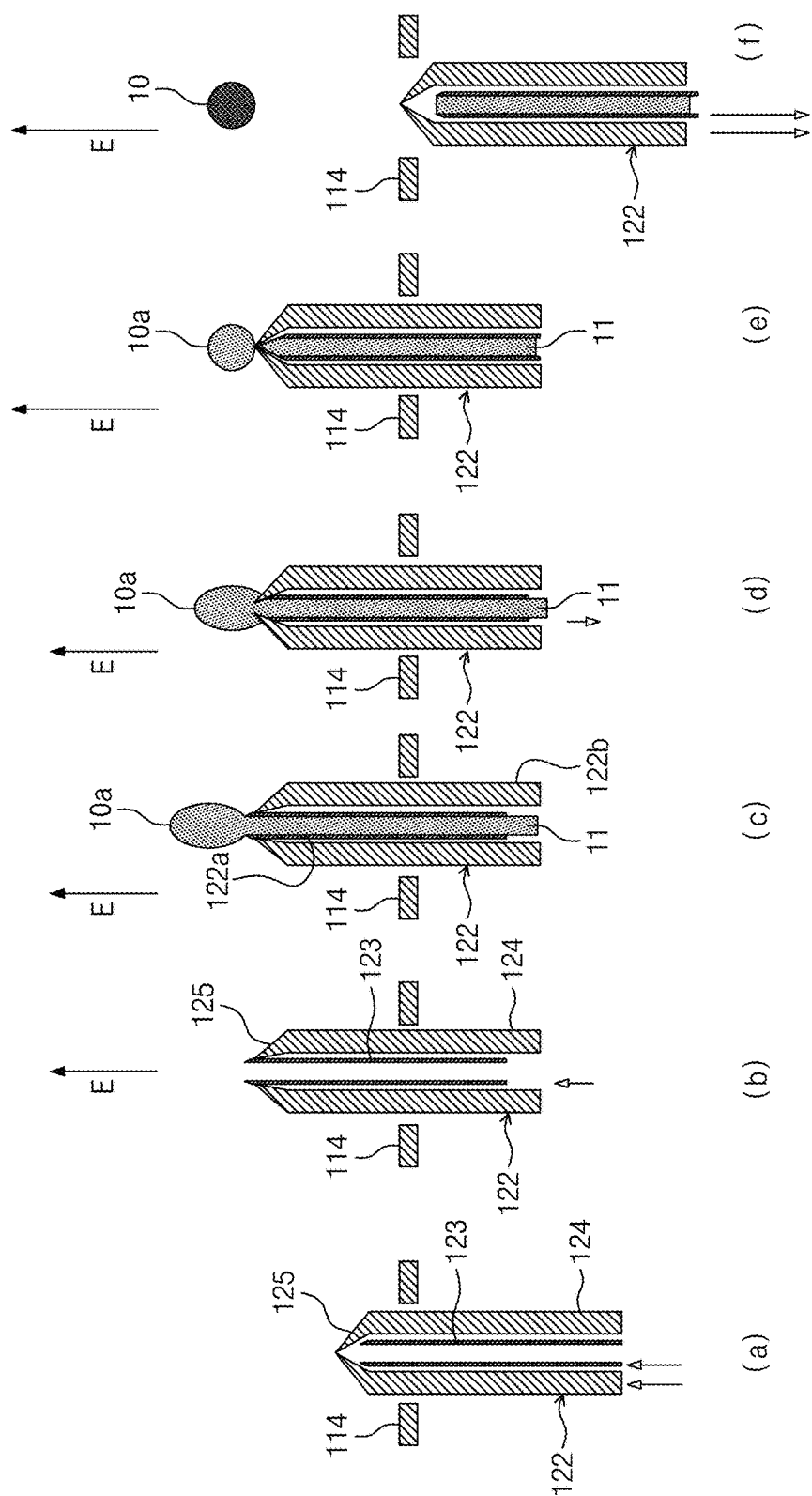

KDP Crystal

NaCl Crystal

FIG. 11
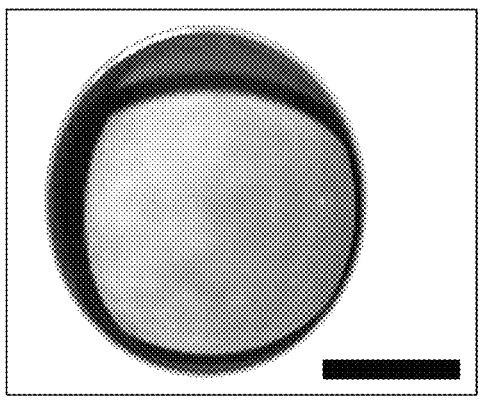 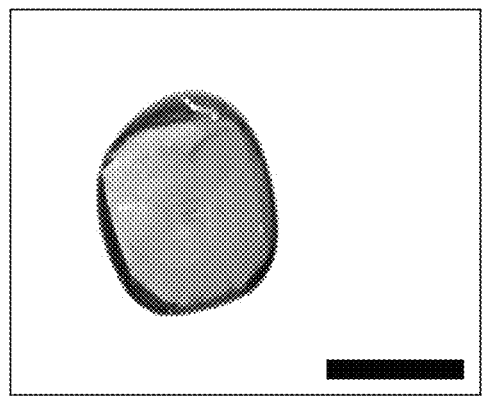

ELECTROSTATIC LEVITATION CRYSTAL GROWTH APPARATUS COMPRISING A DROPLET DISPENSER

CROSS-REFERENCE TO RELATED APPLICATIONS

This application is a continuation of and claims priority to PCT/KR2015/001122 filed on Feb. 4, 2015, which claims priority to Korea Patent Application No. 10-2014-0023883 filed on Feb. 28, 2014, the entireties of which are both hereby incorporated by reference.

BACKGROUND

The present disclosure relates to crystal growth apparatus, and in particular, to an electrostatic levitation crystal growth apparatus.

A single crystal is a solid material in which atoms are regularly arranged. A crystal seed of several nanometers is called "crystal nucleus". A crystal growth may refer to a process of growing the crystal nucleus (for example, to form a bulk pattern of a micrometer or larger).

A single crystal growth technology is essential for a materials industry and/or for a materials science. For example, a potassium dihydrogen phosphate (KDP) crystal is used to realize a laser beam. Also, a protein crystal is needed to synthesize a protein and to precisely analyze a structure of a protein. The KDP crystal is a nonlinear optical material, and a high-purity defect-free single crystal is required for its optical function. For the protein single crystal, a high-purity defect-free single crystal is also needed for development of a new material. However, such single crystals are needed to have a grain size ranging from several hundred micrometers to several meters.

The term 'dissolution' refers to a process of dissolving a solute in a liquid solution. The solution may be a mixture of solute and solvent. The solution may be divided into the solvent and the solute. The term 'solubility' refers to the extent in which a solute at a saturated state is dissolved in a given solvent, and typically, it refers to the maximum amount (g) of solute that can be dissolved in 100 g solvent. The solubility may depend on temperature and kinds of the solvent and solute. In most situations, the higher the temperature, the higher the solubility of a solid substance. A vapor pressure of solution may mean the pressure exerted by a vapor in a dynamic equilibrium state with its solid or liquid.

If a solvent is evaporated from a solution, the solution may become a saturated or supersaturated solution whose concentration is higher than its solubility. In the case where, in a solution having higher concentration than its solubility, the solution temperature is decreased or the solvent is evaporated, the solute may be precipitated. By the precipitation, a crystal may be formed from the solution in which crystalline solid is dissolved. In a process of forming the saturated solution, water may be used as the solvent. In a conventional aqueous solution crystal growth method, a crystal may be grown from a single crystal seed that is suspended in a bath filled with a solution. It may take a long time to grow a crystal by the aqueous solution crystal growth method.

By using the aqueous solution crystal growth method, it may be possible to obtain large size single crystals. However, a lot of time and a high-purity seed crystal are required for the aqueous solution crystal growth method.

In the meantime, if the solvent is evaporated, the solute may be precipitated from the solution contained in a container or crucible. However, the precipitated solute may hardly have the single crystal structure, because an interaction between the crucible and the solution disturbs the formation of the single crystal structure.

To grow a single crystal, it is necessary to restrain impurities from being contained in the crystal. Even when the restraint of impurity is successfully achieved, a crucible, in which aqueous solution is contained, may serve as the impurity. For example, the single crystal growth may be disturbed by the crucible, and as a result, a polycrystalline structure may be formed.

A crystal growth rate or a formation of a crystal nucleus is dependent on a supersaturation level of the aqueous solution. In the case that a crucible is used, the crucible may serve as an impurity source, and a wall of the crucible may lead to a difficulty in achieving a supersaturated state.

Accordingly, a non-contact crystal growth method, in which a crucible for containing the solvent is not used, is needed. In the non-contact crystal growth method, an aqueous solution may be levitated, and a levitated droplet may be used for the single crystal growth. The use of the levitated droplet may make it possible to effectively prevent the container serving as the impurity sources from being interacted with the solvent.

SUMMARY

Some embodiments of the inventive concept provide a method of growing a single crystal using evaporation of electrostatically levitated solution. The electrostatic levitation technique may make it possible to reduce an external impact (e.g., vibration energy) to be exerted on a solution. An evaporation method using the electrostatic levitation technique may be used to realize a supersaturated state and to induce formation and growth of a crystal.

According to some embodiments of the inventive concept, an electrostatic levitation crystal growth apparatus may include an upper electrode, a lower electrode vertically spaced apart from the upper electrode, a power supply unit configured to apply a vertical electrostatic field between the upper electrode and the lower electrode, and a droplet dispenser configured to eject a solution into a region between the upper and lower electrodes and thereby to form a solution droplet. The solution droplet may be maintained in a charged state and may be electrostatically levitated against gravity by the vertical electrostatic field, the solution droplet may be evaporated in the electrostatically levitated state, and a solute dissolved in the solution may be grown to form a crystal.

In some embodiments, the solution droplet may be charged with the same type of charges as that of the lower electrode, through a triboelectric charging with the droplet dispenser.

In some embodiments, the solution droplet may be electrostatically levitated in an air pressure.

In some embodiments, the droplet dispenser may include a nozzle unit configured to eject a preliminary solution droplet. The nozzle unit may include a conductive material, the conductive material may be maintained at the same electric potential as the lower electrode, and the conductive material may be used to charge the preliminary solution droplet with positive charges.

In some embodiments, the lower electrode may be grounded, and the upper electrode may be maintained at a negative voltage.

In some embodiments, the droplet dispenser may include a nozzle unit configured to eject a preliminary solution droplet. The nozzle unit may include a needle providing a fluid passage, the needle being configured to eject the solution and to form the preliminary solution droplet, and a droplet cutting unit enclosing the needle and including an upper cover with a hole. The hole may be configured to be opened, when an end portion of the needle passes through the hole. The droplet cutting unit may be configured to cut the ejected preliminary solution droplet and thereby to form a solution droplet, when the preliminary solution droplet may be ejected from the needle that protrudes above the upper cover.

In some embodiments, the upper cover of the droplet cutting unit may be a cone-shaped structure, and the upper cover may include a plurality of slits extending from an apex of the upper cover in a radial direction.

In some embodiments, the nozzle unit may be formed of or coated with a water-repellent or hydrophobic material.

In some embodiments, the upper cover may be formed of a stretchable or elastic material.

In some embodiments, the droplet dispenser may include a needle linear motion driving unit, which is configured to allow for a vertical motion of the needle, and a droplet cutting linear motion driving unit, which is configured to allow for a vertical motion of the droplet cutting unit.

In some embodiments, an end portion of the nozzle unit of the droplet dispenser may be positioned between the lower electrode and the upper electrode through a through-hole formed at a center of the lower electrode.

In some embodiments, the apparatus may further include a pair of first auxiliary electrodes configured to apply a first auxiliary electric field to a plane perpendicular to a center axis of the lower electrode and disposed to face each other with the solution droplet interposed therebetween, a pair of second auxiliary electrodes configured to apply a second auxiliary electric field to a plane perpendicular to the center axis of the lower electrode and disposed to face each other with the solution droplet interposed therebetween, a first auxiliary power configured to apply a first auxiliary voltage between the first auxiliary electrodes, and a second auxiliary power configured to apply a second auxiliary voltage between the second auxiliary electrodes. The first auxiliary electric field may be substantially orthogonal to the second auxiliary electric field.

In some embodiments, the apparatus may further include at least one of a vertical position measuring light source configured to irradiate light onto the levitated solution droplet, a vertical position detection unit disposed to face the position measuring light source and configured to detect a position of the levitated solution droplet, a crystallization-inducing probe configured to be in contact with the levitated solution droplet and induce formation of a crystal, a sealing unit surrounding the levitated solution droplet and providing a sealed space, a temperature control unit configured to control an internal air temperature of the sealing unit, and a humidity control unit configured to control an internal humidity of the sealing unit.

In some embodiments, the crystal may be formed of $AH_2PO_4$ (A=K, NH4, Cs), $ABCl_3$ (A=Cs, K, Rb; B= Co, Cu, Zn, Cd, Mn), $LiASO_4$ (A=Cs, K), $CuSO_4.5H_2O$, $K_3Fe(CN)_6$, DKDP, $KDCO_3$, $NiSO_4.6H_2O$, $NaKC_4H_4O_6$ (potassium sodium tartrate, Rochelle Salt), $(NH_2CH_2COOH)_3.H_2SO_4$ (triglycine sulfate; TGS), $KD_2PO_4$ (deuterated potassium dihydrogen phosphate; DKDP), NaCl, protein crystal, or $KH_2PO_4$ (potassium dihydrogen phosphate; KDP).

According to some embodiments of the inventive concept, a method of growing a crystal using an electrostatic levitation technique may include applying a vertical electrostatic field between an upper electrode and a lower electrode against a direction of gravity, levitating a solution droplet between the upper electrode and the lower electrode, evaporating a solvent from the solution droplet to form a supersaturated solution, creating a crystal nucleus in the supersaturated solution, and growing the crystal nucleus to form a crystal.

In some embodiments, the levitating of the solution droplet between the upper electrode and the lower electrode may include elevating a needle and a solution cutting unit enclosing the needle through a through-hole formed at a center of the lower electrode, applying a DC electric potential, which is higher than an electric potential of the upper electrode, to the needle, ejecting a solution through an end portion of the elevated needle to form a preliminary solution droplet, charging the preliminary solution droplet with positive charges, lowering the needle or elevating the solution cutting unit to cut the preliminary solution droplet, and lowering the solution cutting unit enclosing the needle and needle.

In some embodiments, the levitating of the solution droplet between the upper electrode and the lower electrode may include elevating a needle through a through-hole formed at a center of the lower electrode, applying a DC electric potential, which is higher than an electric potential of the upper electrode, to the needle, ejecting a solution through an end portion of the elevated needle to form a preliminary solution droplet, charging the preliminary solution droplet with positive charges, increasing a magnitude of the vertical electrostatic field, and lowering the needle.

In some embodiments, the levitating of the solution droplet between the upper electrode and the lower electrode may include elevating a needle through a through-hole formed at a center of the lower electrode, ejecting a solution through an end portion of the elevated needle to form a preliminary solution droplet, charging the preliminary solution droplet with positive charges, and lowering the needle.

In some embodiments, the crystal may be formed of $AH_2PO_4$ (A=K, NH4, Cs), $ABCl_3$ (A=Cs, K, Rb; B= Co, Cu, Zn, Cd, Mn), $LiASO_4$ (A=Cs, K), $CuSO_4.5H_2O$, $K_3Fe(CN)_6$, DKDP, $KDCO_3$, $NiSO_4.6H_2O$, $NaKC_4H_4O_6$ (potassium sodium tartrate, Rochelle Salt), $(NH_2CH_2COOH)_3.H_2SO_4$ (triglycine sulfate; TGS), $KD_2PO_4$ (deuterated potassium dihydrogen phosphate; DKDP), NaCl, protein crystal, or $KH_2PO_4$ (potassium dihydrogen phosphate; KDP).

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 4 is a sectional view illustrating an operation of the electrostatic levitation apparatus of FIG. 1.

FIG. 11 includes images showing a growth of a single crystal in an aqueous solution KDP according to example embodiments of the inventive concept.

DETAILED DESCRIPTION

Figure 1:
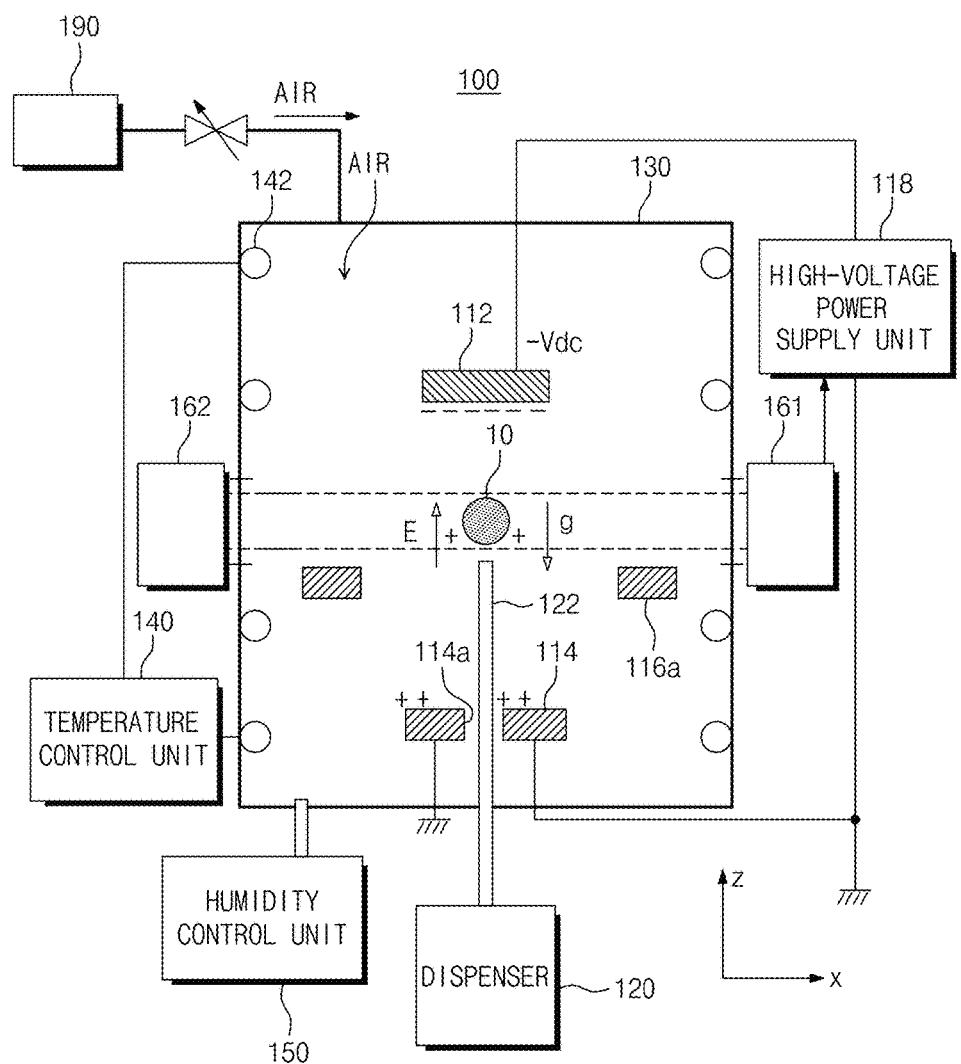
FIG. 1 is a sectional view schematically illustrating an electrostatic levitation crystal growth apparatus according to example embodiments of the inventive concept.

Levitation methods may include an acoustic levitation method, an ultrasonic levitation method, a magnetic levitation method, an electrodynamic levitation method, and an electrostatic levitation method.

In aqueous solution, a crystal growth may depend critically on a levitation method.

In the case where the acoustic levitation method is used, it may be possible to easily levitate aqueous solution. However, in a levitated state, a sound wave or an ultrasonic wave may exert a sound pressure on a sample, and this may lead to an internal fluctuation of the sample. The internal vibration may break a quasi-static state or a supersaturated state, and thus, this may lead to occurrence of a polycrystalline structure in the crystal growth. In addition, the sound pressure may deform a shape of a sample and may lead to an increase in temperature of the sample (e.g., higher than a neighboring temperature). In this sense, the acoustic levitation apparatus may be unsuitable for the single crystal growth.

The magnetic levitation method may have a disadvantage, in that it can be applied for only a magnetic material.

US Patent Publication No. US2009/0076294A1 discloses an example of the electrodynamic levitation method. In an electrodynamic levitation apparatus, an electromagnetic field is used to levitate a solution droplet. However, a size of a solution droplet, which can be levitated by the electrodynamic levitation method, may range from several tens to several hundred micrometers, and thus, a diameter of a resulting crystal may be very small (e.g., less than a millimeter). In the case where the electrodynamic levitation method is used, it is difficult to obtain a single crystal with a diameter of several millimeters.

A sound wave or a time-varying electric field may affect an internal portion of a levitated sample. Thus, a non-contact crystal growth method capable of preventing an external fluctuation may be required for the single crystal growth. Furthermore, there is a demand for a novel crystal growth method, allowing a single crystal to be grown to a diameter of several millimeters. However, a method of using levitated solution to grow a single crystal with a diameter of several millimeters has not been reported until now.

An electrostatic levitation apparatus may be configured to levitate a charged solution droplet in the direction opposite to the gravity. This may make it possible to remove a container or crucible from the electrostatic levitation apparatus, during a crystal growth process. Electric charges may be distributed on only a surface of the electrostatically levitated solution droplet. This may make it possible to minimize the external fluctuation, and thus, the electrostatic levitation apparatus may be used to stably levitate a solution droplet.

According to some embodiments of the inventive concept, a crystal growth method may include evaporating a solvent from an electrostatically levitated solution to provide a single crystalline solute. The use of the electrostatic levitation technology may make it possible to suppress an external impact (e.g., vibration energy of solution).

In an electrostatic levitation apparatus according to some embodiments of the inventive concept, a nozzle unit of a droplet dispenser may be configured to eject a charged preliminary solution droplet having a size of several millimeters or larger. However, in the case where the preliminary solution droplet has high viscosity, there may be a difficulty in separating the preliminary solution droplet from the nozzle unit. A solution cutting unit may be used to separate the preliminary solution droplet from the nozzle unit. Accordingly, it may be possible to electrostatically levitate a solution droplet having a size of several millimeters or larger.

According to some embodiments of the inventive concept, the electrostatic levitation apparatus may not apply a sound pressure to a levitated solution droplet, unlike the acoustic or ultrasonic levitation apparatus that is configured to apply a sound pressure to a levitated solution droplet. Thus, the electrostatic levitation apparatus may not affect an internal portion of the levitated solution droplet. The electrostatic levitation apparatus may allow a crystal to be stably grown in the levitated solution droplet. Furthermore, since the solvent is evaporated from the electrostatically-levitated solution droplet, the levitated solution droplet may be in a supersaturated state. This may make it possible to stably grow a crystal in a solution droplet in the supersaturated state.

In the case of the acoustic or ultrasonic levitation techniques, a sample may be deformed by a sound pressure applied thereto. It may be difficult to measure a volume of the deformed sample. Accordingly, there may be a difficulty in measuring a variation in density or concentration of a levitated solution droplet.

According to some embodiments of the inventive concept, the electrostatic levitation apparatus may be configured to maintain a levitated solution droplet at a specific shape (e.g., a spherical shape). This may make it possible to accurately measure a volume of the levitated solution droplet.

According to some embodiments of the inventive concept, the electrostatic levitation apparatus may be configured to measure physical properties (e.g., viscosity and surface tension) of a levitated solution droplet.

According to some embodiments of the inventive concept, the electrostatic levitation apparatus may be applicable to samples in various science and technology fields (e.g., biology, colloid, physics, chemistry, and so forth).

According to some embodiments of the inventive concept, the electrostatic levitation apparatus may be used to produce a high-purity single crystal having a size of several hundred micrometers or larger.

According to some embodiments of the inventive concept, the electrostatic levitation apparatus may be used to levitate a sample having a size of several millimeters or larger. Accordingly, it may be possible to perform a real-time observation of a crystallization mechanism or a crystallization step of the sample.

According to some embodiments of the inventive concept, the electrostatic levitation apparatus may be configured to allow a levitated solution droplet to be in a supersaturated state. The extent of supersaturation may determine a crystal growth rate. In the case of the conventional crystal growth process performed in a bath, a crystal may be grown from a bottom or side surface of the bath, when in the supersaturated state, and this may lead to a difficulty in growing a single crystal. That is, in the conventional crystal growth process to be performed in the bath, there is a limitation on the supersaturated state. By contrast, the electrostatic levitation apparatus may be configured to realize levitation of a solution droplet, without the use of a bath, and thus, it may be possible to realize a highly supersaturated state and consequently to reduce a process time taken to grow a single crystal.

According to some embodiments of the inventive concept, unlike the sound pressure levitation apparatus or the electrodynamic levitation apparatus, the electrostatic levitation apparatus may be configured to prevent the crystal growth process from being affected by an external force (e.g., a sound pressure or an electromagnetic force). Accordingly, it may be possible to control a supersaturation level at a desired level during the crystal growth process. By making a contact between a probe causing the crystal growth and a supersaturated solution, it is possible to study a crystal growth mechanism on the basis of the extent of supersaturation.

Since a supersaturated solution prepared by the electrostatic levitation apparatus is in a quasi-stable state, it is possible to produce a new quasi-stable material.

Irradiation of an ultraviolet light may allow a levitated polymer to be uniformly hardened. Furthermore, the irradiation of an ultraviolet light may allow for a uniform phase transition of a levitated protein liquid.

Hereinafter, example embodiments of the inventive concept will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

FIG. 1 is a sectional view schematically illustrating an electrostatic levitation crystal growth apparatus according to example embodiments of the inventive concept.

Figure 2:
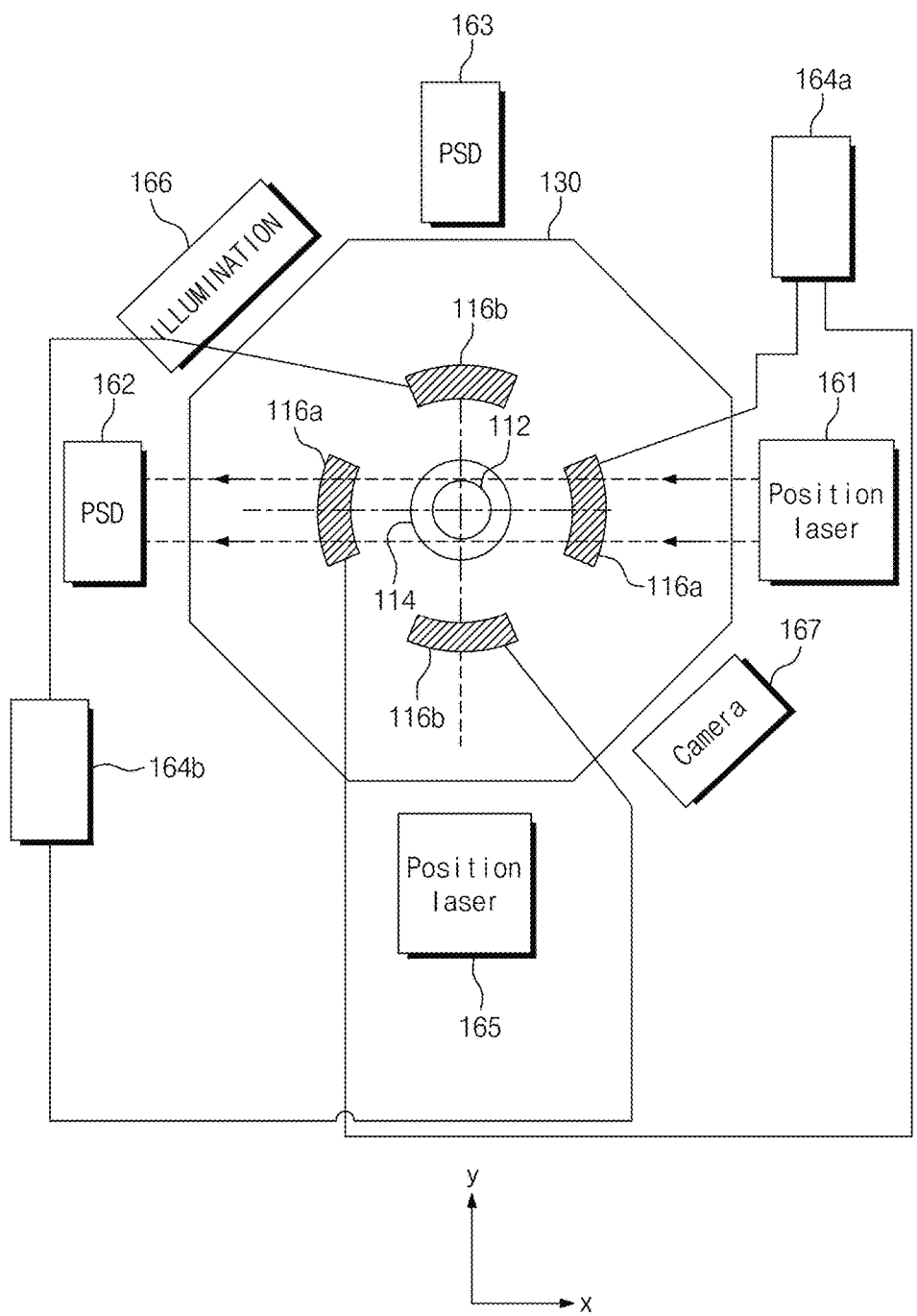
FIG. 2 is a plan view of the electrostatic levitation crystal growth apparatus of FIG. 1.

FIG. 2 is a plan view of the electrostatic levitation crystal growth apparatus of FIG. 1.

Figure 3A:
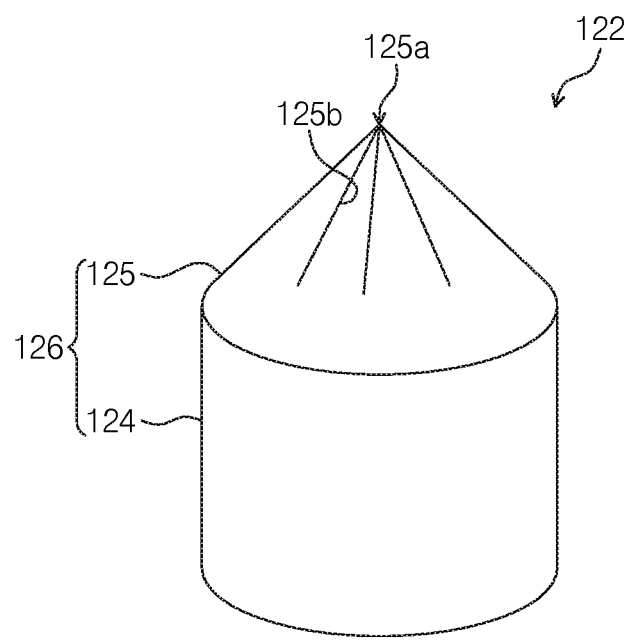
FIG. 3A is a perspective view illustrating the nozzle unit of the droplet dispenser of FIG. 1.

FIG. 3A is a perspective view illustrating the nozzle unit of the droplet dispenser of FIG. 1.

Figure 3B:
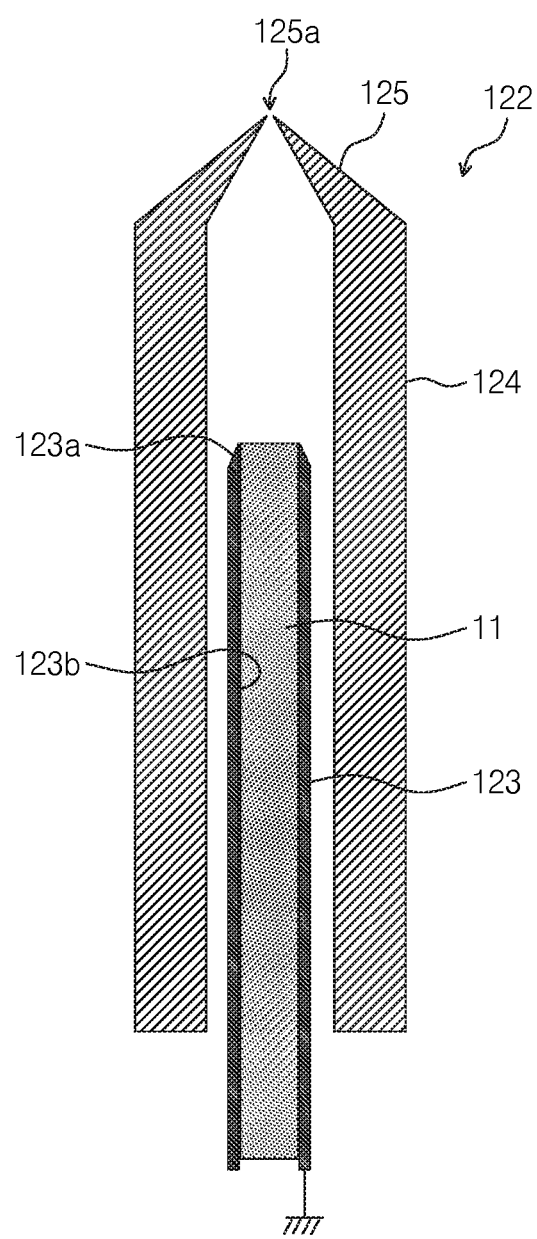
FIG. 3B is a sectional view illustrating the nozzle unit of FIG. 3A.

FIG. 3B is a sectional view illustrating the nozzle unit of FIG. 3A.

FIG. 4 is a sectional view illustrating an operation of the electrostatic levitation apparatus of FIG. 1.

Figure 5:
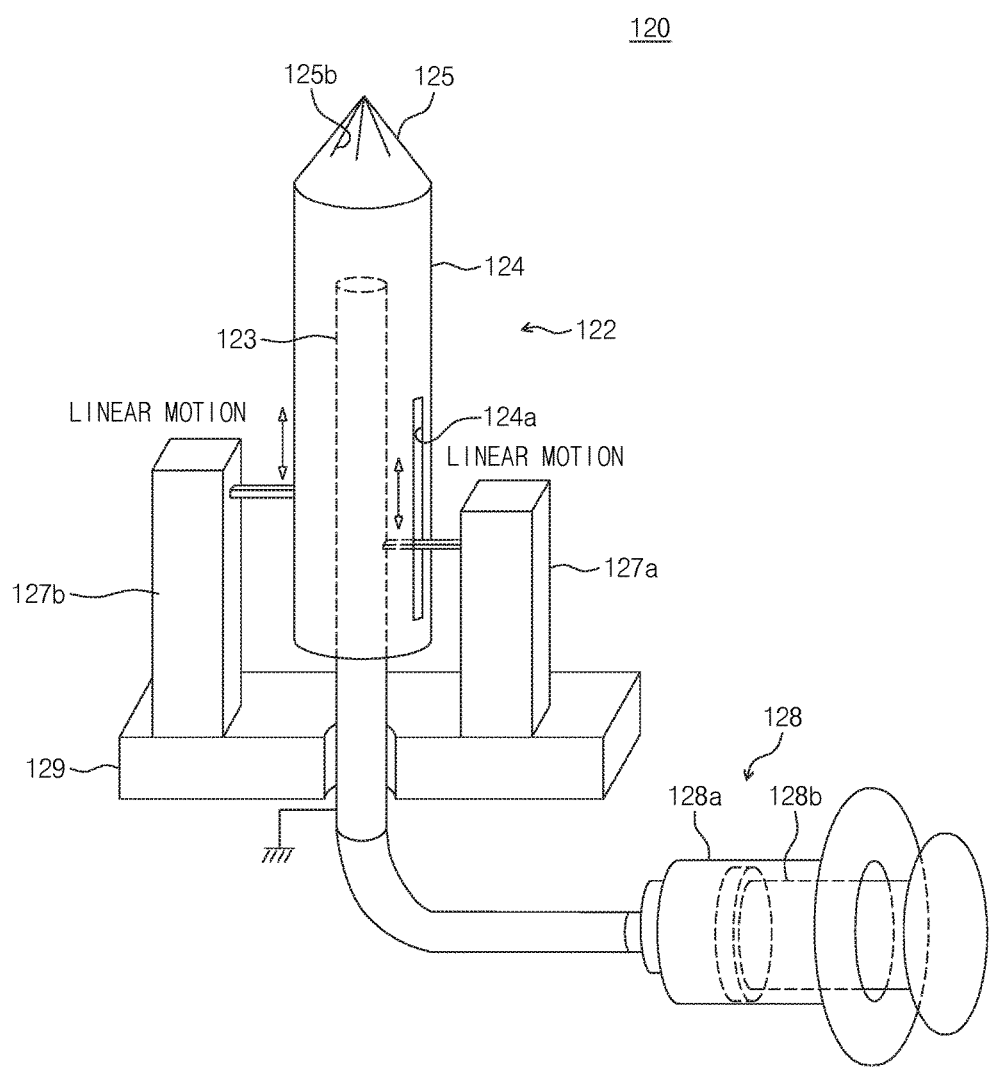
FIG. 5 is a perspective view illustrating a droplet dispenser.

FIG. 5 is a perspective view illustrating a droplet dispenser.

Referring to FIGS. 1 through 5, an electrostatic levitation crystal growth apparatus 100 may include an upper electrode 112, a lower electrode 114 vertically spaced apart from the upper electrode 112, a power supply unit 118, which is configured to apply a vertical electrostatic field between the upper electrode 112 and the lower electrode 114, and a droplet dispenser 120, which is configured to eject solution into a region between the upper electrode 112 and the lower electrode 114 and thereby to form a solution droplet. The solution droplet 10 may be maintained in a charged state, and thus, the solution droplet 10 may be electrostatically levitated against the downward force of gravity by the vertical electrostatic field. The solution droplet may be evaporated in the electrostatically levitated state, and a solute dissolved in the solution may be grown to form a crystal.

The upper electrode 112 may be a conductive element that is shaped like a circular disk. For example, the upper electrode 112 may be formed of or contain copper. The upper electrode 112 may be maintained to have a negative electric potential with respect to the lower electrode 114. Accordingly, the vertical electrostatic field may have a direction from the lower electrode 114 toward the upper electrode 112. In the case where the solution droplet is positively charged, the electrostatic force, whose direction is opposite to the gravity, may be exerted on the solution droplet. This may make it possible to electrostatically levitate the solution droplet. The upper electrode may be deformed into a spherical or elliptical shape.

The lower electrode 114 may be vertically aligned to the upper electrode 112. The lower electrode 114 may be a conductive element. For example, the lower electrode 114 may be formed of or contain copper. The lower electrode 114 may be maintained to have a positive electric potential with respect to the upper electrode 112. The lower electrode 114 may be grounded. A through-hole 114a may be provided at a center of the lower electrode 114. The through-hole 114a may have a diameter ranging from 5 mm to 15 mm A vertical electrostatic field may be applied between the upper electrode 112 and the lower electrode 114. The vertical electrostatic field may have a direction toward the upper electrode 112 (e.g., a negative z-axis direction). A diameter of the lower electrode 114 may be greater than that of the upper electrode 112. Lines of the electric force may be collimated in a vertical direction. The collimation of the electrostatic field may make it possible to improve stability in a horizontal position of a levitated sample. A ratio in diameter of the lower electrode 114 to the upper electrode 112 may range from 2 through 10. A space between the upper electrode 112 and the lower electrode 114 may range from several tens millimeters to several centimeters.

In the case where the vertical electrostatic field is parallel to the negative z-axis direction, positive surface charges may be induced on a top surface of the lower electrode 114, and negative surface charges may be induced on a bottom surface of the upper electrode 112. An electric potential of the lower electrode 114 may be higher than that of the upper electrode 112. The lower electrode 114 may be grounded, whereas the upper electrode 112 may be maintained at a negative DC voltage.

A space between the upper and lower electrodes 112 and 114 may be filled with an air. A pressure of the air may be substantially a standard atmospheric pressure. Particles in the air may act as impurities for the solution droplet. In some embodiments, the particles in the air may be removed using a filter. A distance between the upper and lower electrodes 112 and 114 may range from several millimeters to several centimeters. An intensity of the vertical electrostatic field applied between the upper and lower electrodes 112 and 114 may be smaller by one to two orders than a dielectric breakdown electric field or a dielectric strength.

A sealing unit 130 may be configured to provide a hermetically-sealed space enclosing the levitated solution droplet. The lower electrode 114 and the lower electrode 114 may be provided in the sealing unit 130. The sealing unit 130 may be a glove box made of an acrylic material. The sealing unit 130 may include an air filter for removing dust particles. Thus, the sealing unit 130 may supply an air, from which dust particles are removed, into the sealing unit 130. A pressure of the sealing unit 130 may be maintained to be substantially equal to or higher than the standard atmospheric pressure. Accordingly, the air in the sealing unit 130 may be slowly exhausted to the outside, thereby preventing dust particles from being entered into the sealing unit.

The sealing unit 130 may be formed of or include at least one of transparent materials (e.g., glass or acrylic materials) to an infrared or visible light. This may allow a real-time monitoring on a position of the levitated solution droplet. The sealing unit 130 may be provided in the form of a hollow polygonal pillar.

As an example, the sealing unit 130 may be provided to have an octagonal pillar shape. The sealing unit 130 may be fixed to a table through a bottom surface thereof. A vertical position measuring light source 161 and a vertical position detection unit 162 may be provided on a pair of opposite side surfaces, respectively. The vertical position measuring light source 161 and the vertical position detection unit 162 may be provided at an outside of the sealing unit 130.

The vertical position measuring light source 161 may be configured to irradiate light onto the levitated solution droplet. For example, the vertical position measuring light source 161 may be configured to emit a laser beam with a beam diameter of several millimeters. The laser beam may be scattered by the levitated solution droplet. The vertical position measuring light source 161 may be configured to emit a helium-neon laser with a visible wavelength.

The vertical position detection unit 162 may be configured to detect a position of the levitated solution droplet using light emitted from the vertical position measuring light source 161. The vertical position detection unit 162 may be a position sensitive detector. As an example, the vertical position detection unit 162 may be a two-dimensional position sensitive detector. The vertical position detection unit 162 may be used to detect vertical and horizontal positions of a solution droplet (e.g., in the z- and y-directions). A vertical position signal containing information on the vertical position may be provided to the power supply unit 118 to control an output voltage from the power supply unit 118. As a result, a vertical position of the solution droplet may be controlled.

The power supply unit 118 may be configured to apply a DC voltage (−Vdc) between the upper and lower electrodes 112 and 114. The power supply unit 118 may include a voltage control unit. The voltage control unit may be configured to perform a proportional-integral-derivative (PID) control. The voltage control unit may receive the vertical position signal from the vertical position measurement unit 162. In detail, if the solution droplet is positioned below a reference position, the intensity of the vertical electrostatic field may be increased. By contrast, if the solution droplet is positioned above the reference position, the intensity of the vertical electrostatic field may be decreased.

The electrostatic levitation apparatus may control the vertical electrostatic field or a vertical voltage to have the direction opposite to the gravity, and thus, a charged sample or a charged solution droplet may be levitated. The charged solution droplet may be in contact with an air at the standard atmospheric pressure. The air may be at room temperature. For example, the temperature of the air may range from 20° C. to 40° C. Dust in the air may be removed by an air filter. Humidity of the air may be constantly preserved. Relative humidity of the air may range from 30% to 90%.

Unlike a conventional electrostatic levitation apparatus designed to be operated at a vacuum state, the electrostatic levitation apparatus according to some embodiments of the inventive concept may be operated at the substantially atmospheric pressure. The electrostatic levitation apparatus designed to be operated at a vacuum state may include auxiliary electrodes 116a and 116b, which are configured to control a position of a sample on a plane (e.g., an x-y plane) perpendicular to the gravity.

The electrostatic levitation apparatus configured to be operated at the air may not include the auxiliary electrodes 116a and 116b, which are configured to control a position of a sample on a plane (e.g., the x-y plane) perpendicular to the gravity. This may be because the air, a viscous fluid, may exert a frictional force or a damping force on the levitated sample.

The electrostatic levitation apparatus configured to be operated at the air may easily control a position of the sample in the vertical direction parallel to the gravity. This may be because the air, a viscous medium, may exert a frictional force or a damping force on the levitated sample. Accordingly, the electrostatic levitation apparatus configured to be operated at the air may allow for stable control of a vertical position of the levitated sample, without fluctuation in vertical position of the levitated sample, compared to that operated at the vacuum state.

The solution droplet 10 may contain a solute dissolved in a solvent. The solvent may be a volatile substance (e.g., water ($H_2O$)). The solute may be nonvolatile. To control an evaporation rate, the solution droplet 10 may contain at least two kinds of solvents. The solute or crystal may be formed of $AH_2PO_4$ (A=K, NH4, Cs), $ABCl_3$ (A=Cs, K, Rb; B=Co, Cu, Zn, Cd, Mn), $LiASO_4$ (A=Cs, K), $CuSO_4.5H_2O$, $K_3Fe(CN)_6$, DKDP, $KDCO_3$, $NiSO_4.6H_2O$, $NaKC_4H_4O_6$ (potassium sodium tartrate, Rochelle Salt), $(NH_2CH_2COOH)_3.H_2SO_4$ (triglycine sulfate; TGS), $KD_2PO_4$ (deuterated potassium dihydrogen phosphate; DKDP), NaCl, protein crystal, or $KH_2PO_4$ (potassium dihydrogen phosphate; KDP).

The solute may be dissolved in a high temperature solvent (e.g., of 30° C. or higher). Thereafter, the solution with the dissolved solute may be cooled down to a low temperature of 30° C. or lower. Thus, the solution may be prepared as a saturated solution.

The droplet dispenser 120 may be configured to provide the solution droplet 10, which is prepared from the solution, into the electrostatic levitation apparatus. Furthermore, the droplet dispenser 120 may also be configured to charge the solution droplet 10 with the same charges as the surface charge of the lower electrode 114. For example, the droplet dispenser 120 may be configured to charge the solution droplet 10 with positive charges.

The droplet dispenser 120 may include a nozzle unit 122 through which a preliminary solution droplet 10a is ejected. The nozzle unit 122 may include a needle 123 providing a fluid passage and a droplet cutting unit 126 enclosing the needle 123. The needle 123 may be configured to eject the solution 11 and to form a preliminary solution droplet 10a, and the droplet cutting unit 126 may include an upper cover 125 with a hole. The hole of the upper cover 125 may be configured to be opened, and this structure of the hole may allow an end portion of the needle to pass therethrough. If, when the needle 123 protrudes above the upper cover 125, the preliminary solution droplet 10a is ejected, the ejected preliminary solution droplet 10a may be cut by the droplet cutting unit 126 to form the solution droplet 10.

The nozzle unit 122 of the droplet dispenser 120 may be inserted through the through-hole 114a that is formed at a center of the lower electrode 114. An end portion of the nozzle unit 122 may be inserted into center regions of the upper electrode 112 and the lower electrode 114 through the through-hole 114a. The nozzle unit 122 may perform its vertical motion through the through-hole 114a. The nozzle unit 122 may be immediately lowered, after the formation of the solution droplet 10.

The needle 123 may be formed of or include a conductive material. The needle 123 may be provided in the form of a cylindrical shell. The needle 123 may have a fluid passage 123b formed therein. An end portion of the needle 123 may have a gradually decreasing radius in its extension direction or may have a tapered portion 123a. The tapered portion 123a may make it possible to reduce an impact caused by the droplet cutting unit 126. Accordingly, the tapered portion 123a may suppress the cut solution droplet from falling. The needle 123 may be grounded. An electrostatic field may be generated between the end portion of the needle 123 and the upper electrode 112. Positive charges may be accumulated at the end portion of the needle 123. The end portion of the needle 123 may be configured to eject the solution, and an opposite end portion of the needle 123 may be connected to a solution delivery unit 128.

In the case where a vertical electrostatic field is applied between the upper and lower electrodes 112 and 114, negative surface charges may be induced on a bottom surface of the upper electrode 112. Also, positive surface charges may be induced on a top surface of the lower electrode 114. In the case where the end portion of the needle 123 is positioned between the upper and lower electrodes 112 and 114, the needle 123 may have an electric potential higher than that of the upper electrode 112. Accordingly, positive charges may be induced at the end portion of the needle 123. The electrostatic field between the needle 123 and the upper electrode 112 may be weaker than a dielectric breakdown electrostatic electric field.

In general, the preliminary solution droplet 10a may have viscosity, a surface tension relative to the nozzle unit, or a wetting force. This may lead to a difficulty in levitating the preliminary solution droplet 10a from the end portion of the nozzle unit 122, using the vertical electrostatic field or the electrostatic field between the needle and the upper electrode. Accordingly, it is necessary to develop a levitation method capable of easily cutting the preliminary solution droplet 10a.

The end portion of the needle 123 may provide positive charges to the preliminary solution droplet 10a through a triboelectric charging and/or an induction charging. In the case where the needle 123 is a grounded conductor, an electrostatic field may induce positive charges on a surface of the needle 123. The preliminary solution droplet 10a may be positively charged by being in contact with the needle 123. The triboelectric charging may be caused by friction, contact, or separation. The solution droplet 10 may be positively charged by the electrostatic field.

According to other embodiments of the inventive concept, the needle 123 may be an insulator. In this case, the droplet cutting unit 126 may be a grounded conductive element. Accordingly, positive charges may be induced on a surface of the droplet cutting unit 126 by the vertical electrostatic field. The positive charges of the droplet cutting unit 126 may be transferred to the preliminary solution droplet 10a through the triboelectric or induction charging with the preliminary solution droplet 10a.

According to still other embodiments of the inventive concept, the needle 123 may be a grounded conductive element, and the droplet cutting unit 126 may also be a grounded conductive element. In this case, positive charges may be induced on a surface of the droplet cutting unit 126 and an end portion of the needle 123 by the vertical electrostatic field. The positive charges of the droplet cutting unit 126 and the positive charges of the needle 123 may be transferred to the preliminary solution droplet 10a through the triboelectric or induction charging with the preliminary solution droplet 10a. In certain embodiments, the preliminary solution droplet 10a may have positive charges induced by the vertical electrostatic field.

The positive charges provided to the preliminary solution droplet 10a and the electrostatic force caused by the vertical electrostatic field may cancel the gravity exerted on the solution droplet 10. However, the preliminary solution droplet 10a may be in contact with a fraction of the solution in the needle 123. In this case, due to its viscosity and the electrostatic field, the preliminary solution droplet 10a may be deformed to have an elliptical shape.

The needle may have an inner diameter ranging from several tens micrometer to several millimeters. The needle may have an outer diameter ranging from several tens micrometer to several millimeters. The inner diameter of the needle may depend on a size or diameter of a solution droplet. In some embodiments, the diameter of the solution droplet may range from 1 mm to 10 mm Wetting refers to a phenomenon in which, when a liquid is attached to a solid surface, the liquid spread across the solid surface by an interaction between atoms in the solid and liquid. The smaller a wetting angle, the better the wetting property. The needle 123 may be coated with a water-repellent or hydrophobic material. This may make it possible to reduce a contact area between the needle 123 and the preliminary solution droplet 10a and consequently to increase a wetting angle therebetween. Thus, the preliminary solution droplet 10a may be easily separated from the needle 123 by the vertical electrostatic field.

The droplet cutting unit 126 may be configured to cut the preliminary solution droplet 10a. For example, the droplet cutting unit 126 may be used to physically separate the preliminary solution droplet 10a from the solution 11 filling the needle 123. Accordingly, the cut solution droplet may be electrostatically levitated. The droplet cutting unit 126 may include a body portion 124 enclosing the needle 123 and an upper cover 125 connected to the body portion 124. The droplet cutting unit 126 may be configured to move in a vertical direction with respect to the needle 123. Accordingly, the droplet cutting unit 126 may be used to cut the preliminary solution droplet 10a ejected from the end portion of the needle.

The upper cover 125 of the droplet cutting unit 126 may be a cone-shaped structure. The upper cover 125 may include an apex 125a and a plurality of slits 125b extending from the apex 125a in a radial direction. In certain embodiments, the upper cover 125 may include at least one gap that extends in the radial direction and thereby allows the apex 125a to be opened. In the case where the end portion of the needle 123 protrudes toward the outside through the apex 125a of the upper cover 125, the apex 125a may be opened. By contrast, if the end portion of the needle 123 is lowered in a downward direction, the tapered portion 123a of the needle 123 may be in contact with the upper cover 125. Thus, the droplet cutting unit 126 may cut the preliminary solution droplet 10a along the needle 123 without an impact.

The droplet cutting unit 126 may be formed of or include at least one of Teflon, silicone, vinyl chloride, polyethylene, polypropylene, polyurethane, acrylic, rubber, copper, polyester, aluminum, or nylon. The droplet cutting unit 126 may be formed of or coated with a water-repellent material or a hydrophobic material. In the case where the droplet cutting unit 126 is formed of a conductive material, the droplet cutting unit 126 may be grounded or may have an electric potential higher than that of the upper electrode 112. Accordingly, the droplet cutting unit 126 may be positively charged under the vertical electrostatic field.

The upper cover 125 may be formed of or include a stretchable or elastic material. Thus, in the case where the needle 123 protrudes above the apex 125a of the upper cover 125 due to its vertical motion, the upper cover 125 may be opened. Also, in the case where the needle 123 is positioned in the upper cover 125 due to its vertical motion, the apex 125a may be closed, and consequently, the upper cover 124 may be restored to its original shape.

When the preliminary solution droplet 10a is cut by the upper cover 125, the preliminary solution droplet 10a may be positioned on the apex 125a of the upper cover 125. In the case where the upper cover 125 is formed of or coated with the water-repellent material or the hydrophobic material, it may be possible to minimize a contact area between the preliminary solution droplet 10a and the upper cover 125. Thus, the preliminary solution droplet 10a may be electrostatically levitated by the vertical electrostatic field. In certain embodiments, a magnitude of the vertical electrostatic field may be controlled (e.g., increased) to levitate the preliminary solution droplet 10a positioned on the apex 125a of the upper cover 125.

The droplet dispenser 120 may include a needle linear motion driving unit 127a, which is configured to allow the vertical motion of the needle 123, and a droplet cutting linear motion driving unit 127b, which is configured to allow the vertical motion of the droplet cutting unit 126.

The needle linear motion driving unit 127a may be connected to a body portion of the droplet cutting unit 126. The needle linear motion driving unit 127a may include a motor or a piston, allowing the vertical motion of the needle. The droplet cutting unit 126 may be provided at a side of the body portion 124 and may include a long groove 124a extending in the vertical direction. The needle linear motion driving unit 127a may be connected to the needle through the long groove 124a.

The droplet cutting linear motion driving unit 127b may be connected to the droplet cutting unit 126. The droplet cutting linear motion driving unit 127b may include a linear motion device (e.g., a motor or a piston), allowing a linear motion of the droplet cutting unit. In the case where the preliminary solution droplet is cut by the droplet cutting unit, both of the needle and the droplet cutting unit 126 may be moved in a downward direction at a high speed. Thus, the solution droplet may be separated from the droplet dispenser.

The needle linear motion driving unit 127a and the droplet cutting linear motion driving unit 127b may be mounted on a supporting plate 129 or a table. The needle may be grounded. Accordingly, the needle 123 may provide electric charges to the solution droplet through a triboelectric charging.

The solution delivery unit 128 may be configured to exert a pressure on the needle 123 and thereby to cause a motion of a solution. The solution delivery unit 128 may include a barrel 128a and a plunger 128b. The solution may be contained in the barrel 128a. The plunger 128b may be inserted in the barrel 128a and may be configured to exert a pressure to the solution. Accordingly, the solution may be ejected through the needle 123. During the ejection of the solution through the needle 123, an electric field may be applied between the upper electrode 112 and the lower electrode 114. The plunger 128b may be connected to a pressure control unit which is configured to control an ejection amount of the solution.

A pair of the first auxiliary electrodes 116a may be configured to apply a first auxiliary electric field to a plane perpendicular to a center axis of the lower electrode 114.

The pair of the first auxiliary electrodes 116a may be disposed to face each other with the solution droplet interposed therebetween. The first auxiliary electrodes 116a may be shaped like a partial cylindrical shell. The first auxiliary electrodes 116a may be aligned to each other in the x-axis direction.

A pair of the second auxiliary electrodes 116b may be configured to apply a second auxiliary electric field to a plane perpendicular to the center axis of the lower electrode 114. The pair of the second auxiliary electrodes 116b may be disposed to face each other with the solution droplet interposed therebetween. The second auxiliary electrodes 116b may be shaped like a partial cylindrical shell. The second auxiliary electrodes 116b may be aligned to each other in the y-axis direction.

A first auxiliary power 164a may be provided to apply the first auxiliary electric field between the first auxiliary electrodes 116a. A second auxiliary power 164b may be provided to apply the second auxiliary electric field between the second auxiliary electrodes 116b. The first auxiliary electric field and the second auxiliary electric field may be orthogonal to each other on the x-y plane.

A first horizontal position light source and a first horizontal position detection unit may be disposed parallel to the first auxiliary electrodes 116a. For example, the first horizontal position light source and the first horizontal position detection unit may be disposed spaced apart from each other in the x-axis direction connecting the first auxiliary electrodes 116a. The first horizontal position light source and the first horizontal position detection unit may be disposed on the outer side surface of the sealing unit 130. The first auxiliary power 164a may receive a first horizontal position signal from the first horizontal position detection unit and may control the first electric field between the first auxiliary electrodes 116a. Thus, it may be possible to control a position, in a first direction, of the levitated solution droplet.

A second horizontal position light source 165 and a second horizontal position detection unit 163 may be disposed to be parallel to the second auxiliary electrodes 116b. In detail, the second horizontal position light source 165 and the second horizontal position detection unit 163 may be disposed spaced apart from each other in the y-axis direction connecting the second auxiliary electrodes 116b. The second horizontal position light source 165 and the second horizontal position detection unit 163 may be disposed on an outer side surface of the sealing unit 130. The second auxiliary power 164b may receive a second horizontal position signal from the second horizontal position detection unit and may control the second electric field between the second auxiliary electrodes 116b. Thus, it may be possible to control a position, in a second direction, of the levitated solution droplet.

In the case where a two-dimensional detector is used as the vertical position detection unit 162, a position, in the y-axis direction, of the levitated solution droplet may be detected. In this case, the second horizontal position light source may be integrated in the vertical position light source. Also, the second horizontal position detection unit may be integrated in the vertical position detection unit.

A temperature control unit 140 may be configured to control a temperature of an air in the sealing unit 130. The temperature of the air may be controlled to be within a range from 20° C. to 40° C. Preferably, the temperature of the air may range from 25° C. to 30° C. The temperature control unit 140 may be configured to circulate a fluid with a constant temperature along an internal side surface of the sealing unit 130.

A humidity control unit 150 may be configured to control humidity of an air in the sealing unit 130. The humidity control unit 150 may provide moisture into the sealing unit 130 or remove moisture from an internal space of the sealing unit 130. An internal relative humidity of the sealing unit 130 may range from 30% to 90%.

An air pressure control unit 190 may be configured to provide an outer air into the sealing unit 130. In some embodiments, the air pressure control unit 190 may be used in such a way that an internal pressure of the sealing unit 130 is maintained to be higher than the substantially atmospheric pressure.

Preferably, the preliminary solution droplet may be charged using the triboelectric or induction charging method. However, in certain embodiments, other charging methods, such as a photoelectric charging method, may be used to charge the preliminary solution droplet.

In the case where a single crystal is grown in the levitated solution droplet, the single crystal may sink to the bottom of the solution droplet, because the single crystal has a density higher than that of the solution.

Hereinafter, an electrostatic levitation crystal growth method will be described with reference to FIGS. 1 through 3.

A vertical electrostatic field may be applied between the upper electrode 112 and the lower electrode 114, in a direction against the gravity. In the case where the upper electrode 112 is maintained at a negative electric potential and the lower electrode 114 is grounded, the vertical electrostatic field may be generated.

Thereafter, the solution droplet 10 may be levitated between the upper and lower electrodes 112 and 114. In detail, the droplet dispenser 120 may include the nozzle unit 122. The nozzle unit 122 may be configured to move in a vertical direction. The nozzle unit 122 may include the needle 123, which is configured to eject the solution and to be in a grounded state and is formed of a conductive material, and the solution cutting unit 126, which is provided to enclose the needle 123. The needle 123 and the solution cutting unit 126 enclosing the needle 123 may be elevated through the through-hole 114a, which is formed at a center of the lower electrode 114. The needle 123 may be maintained at a DC electric potential that is higher than that of the upper electrode 112. Accordingly, the needle 123 may be positively charged. The solution may be ejected through an end portion of the elevated needle 123. Accordingly, the preliminary solution droplet 10a may be formed on the end portion of the needle 123. The preliminary solution droplet 10a may be positively charged by the needle 123 or the vertical electrostatic field. Owing to the vertical electrostatic field, the charged solution droplet may be shaped like an ellipse, whose longitudinal axis is parallel to the vertical direction. The charged preliminary solution droplet may be cut by lowering the needle 123 or elevating the solution cutting unit. The solution cutting unit 126 may separate the charged preliminary solution droplet substantially from the solution in the needle 123. In certain embodiments, the solution cutting unit 126 may be configured to minimize a contact area between the charged preliminary solution droplet and the solution in the needle 123. The needle 123 and the solution cutting unit enclosing the needle 123 may be lowered. Accordingly, the cut solution droplet, to which the electric field is applied, may be easily levitated.

Thereafter, the solvent of the solution droplet 10 may be evaporated, and the solution droplet 10 may form a supersaturated solution. The solvent may be water. A vapor pressure of the solvent may depend on temperature. Thus, to control the evaporation rate of the solvent, temperature and humidity of the sealing unit may be adjusted. A water vapor pressure of the atmosphere may be less than a saturated water vapor pressure.

Next, a crystal nucleus may be created in the supersaturated solution. Preferably, the number of the crystal nucleus may be one. To suppress an unnecessary creation of the crystal nucleus in the supersaturated solution, it may be necessary to cause convection of the supersaturated solution. In detail, the convection of the supersaturated solution may occur by a local heating (for example, using an infrared laser). Alternatively, the supersaturated solution may be rotated or circulated by a torque using an induced electric field. This may lead to the convection of the supersaturated solution.

Thereafter, the crystal nucleus may be grown to form a crystal. The solute or crystal may be formed of $AH_2PO_4$ (A=K, NH4, Cs), $ABCl_3$ (A=Cs, K, Rb; B= Co, Cu, Zn, Cd, Mn), $LiASO_4$ (A=Cs, K), $CuSO_4.5H_2O$, $K_3Fe(CN)_6$, DKDP, $KDCO_3$, $NiSO_4.6H_2O$, $NaKC_4H_4O_6$ (potassium sodium tartrate, Rochelle Salt), $(NH_2CH_2COOH)_3.H_2SO_4$ (triglycine sulfate; TGS), $KD_2PO_4$ (deuterated potassium dihydrogen phosphate; DKDP), NaCl, protein crystal, or $KH_2PO_4$ (potassium dihydrogen phosphate; KDP).

Figure 6:
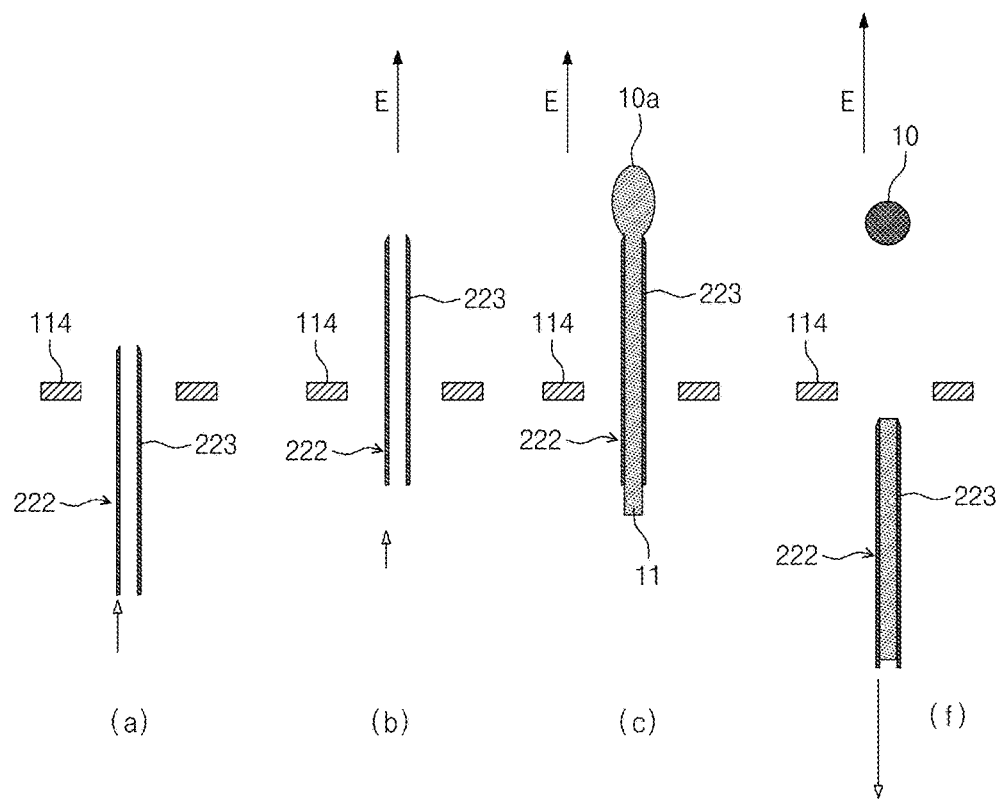
FIG. 6 is a diagram illustrating an electrostatic levitation crystal growth apparatus according to other embodiments of the inventive concept.

FIG. 6 is a diagram illustrating an electrostatic levitation crystal growth apparatus according to other embodiments of the inventive concept.

Hereinafter, an electrostatic levitation crystal growth method according to other embodiments of the inventive concept will be described with reference to FIGS. 1, 2, and 6.

A vertical electrostatic field may be applied between the upper electrode 112 and the lower electrode 114, in a direction against the gravity. The upper electrode 112 may be maintained at a negative electric potential, and the lower electrode 114 may be grounded. In this case, the vertical electrostatic field may be generated.

Thereafter, the solution droplet 10 may be levitated between the upper and lower electrodes 112 and 114. In detail, the droplet dispenser 120 may include a nozzle unit 222. The nozzle unit 222 may be configured to move in a vertical direction. The nozzle unit 222 may include a conductive needle 223 configured to eject a solution. The needle may be elevated through the through-hole 114a, which is formed at a center of the lower electrode 114. The needle may be maintained at a DC electric potential that is higher than that of the upper electrode. Accordingly, the needle may be positively charged. The solution may be ejected through the end portion of the elevated needle. Accordingly, the preliminary solution droplet 10a may be formed on the end portion of the needle. The preliminary solution droplet may be positively charged by the needle or the vertical electrostatic field. Owing to the vertical electrostatic field, the charged solution droplet may be shaped like an ellipse, whose longitudinal axis is parallel to the vertical direction. If strength of the vertical electrostatic field is increased, the charged preliminary solution droplet may be separated from the needle. Accordingly, the cut solution droplet may be levitated.

Thereafter, the solvent of the solution droplet 10 may be evaporated, and the solution droplet 10 may form a supersaturated solution. The solvent may be water. A vapor pressure of the solvent may depend on temperature. Thus, to control the evaporation rate of the solvent, temperature and humidity of the sealing unit may be adjusted. A water vapor pressure of the atmosphere may be lower than a saturated water vapor pressure.

Next, a crystal nucleus may be created in the supersaturated solution. Preferably, the number of the crystal nucleus may be one. To suppress an unnecessary creation of the crystal nucleus in the supersaturated solution, it may be necessary to cause convection of the supersaturated solution. In detail, the convection of the supersaturated solution may occur by a local heating (for example, using an infrared laser). Alternatively, the supersaturated solution may be rotated or circulated by a torque using an induced electric field. This may lead to the convection of the supersaturated solution.

Thereafter, the crystal nucleus may be grown to form a crystal.

In certain embodiments, other method may be used to charge the preliminary solution droplet. For example, a photoelectric charging method and so forth may be used to charge the preliminary solution droplet.

Figure 7:
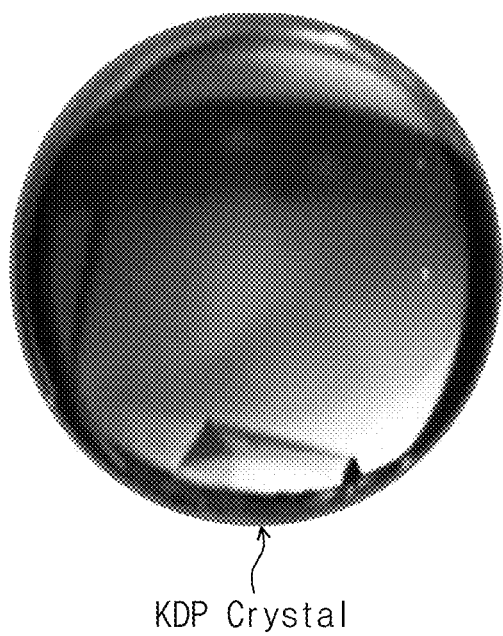
FIG. 7 is an image showing a KDP crystal grown by an electrostatic levitation crystal growth method according to example embodiments of the inventive concept.

FIG. 7 is an image showing a KDP crystal grown by an electrostatic levitation crystal growth method according to example embodiments of the inventive concept.

Figure 8:
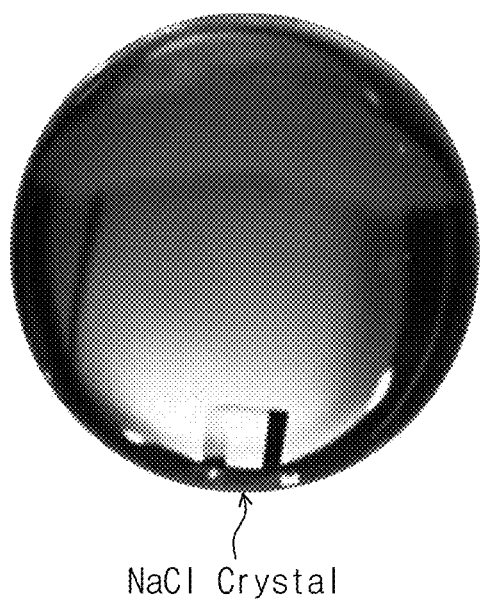
FIG. 8 is an image showing a NaCl crystal grown by an electrostatic levitation crystal growth method according to example embodiments of the inventive concept.

FIG. 8 is an image showing a NaCl crystal grown by an electrostatic levitation crystal growth method according to example embodiments of the inventive concept.

Referring to FIGS. 7 and 8, a $KP_2PO_4$ (KDP) single crystal was precipitated in a bottom region of a supersaturated solution. A NaCl single crystal was precipitated in a bottom region of a supersaturated solution. An aqueous solution levitated in the air may be used to realize a noncontact crystal growth technique. The crystals were spontaneously formed by evaporation. As a result, it was possible to grow a single crystal with high crystallinity and high purity.

Figure 9:
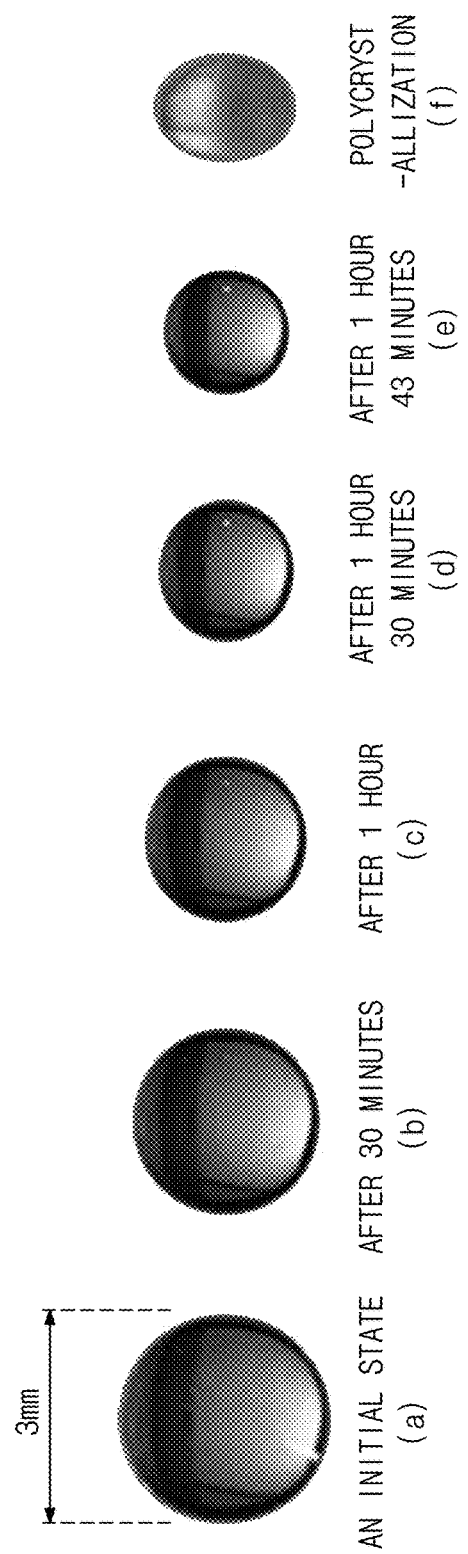
FIG. 9 includes images showing the change in shape of a KDP aqueous solution.

FIG. 9 includes and provides images showing the change in shape of a KDP aqueous solution.

Referring to FIG. 9, the air temperature was 28° C., and an initial size of the levitated solution droplet was 2.5 mm The relative humidity was 50%. Images arranged in a direction from left to right were respectively obtained (a) at an initial state, (b) after 30 minutes, (c) after 1 hour, (d) after 1 hour 30 minutes, (e) after 1 hour 43 minutes, and (f) after polycrystallization, respectively. The image of (f) showed formation of a polycrystalline KDP.

Figure 10:
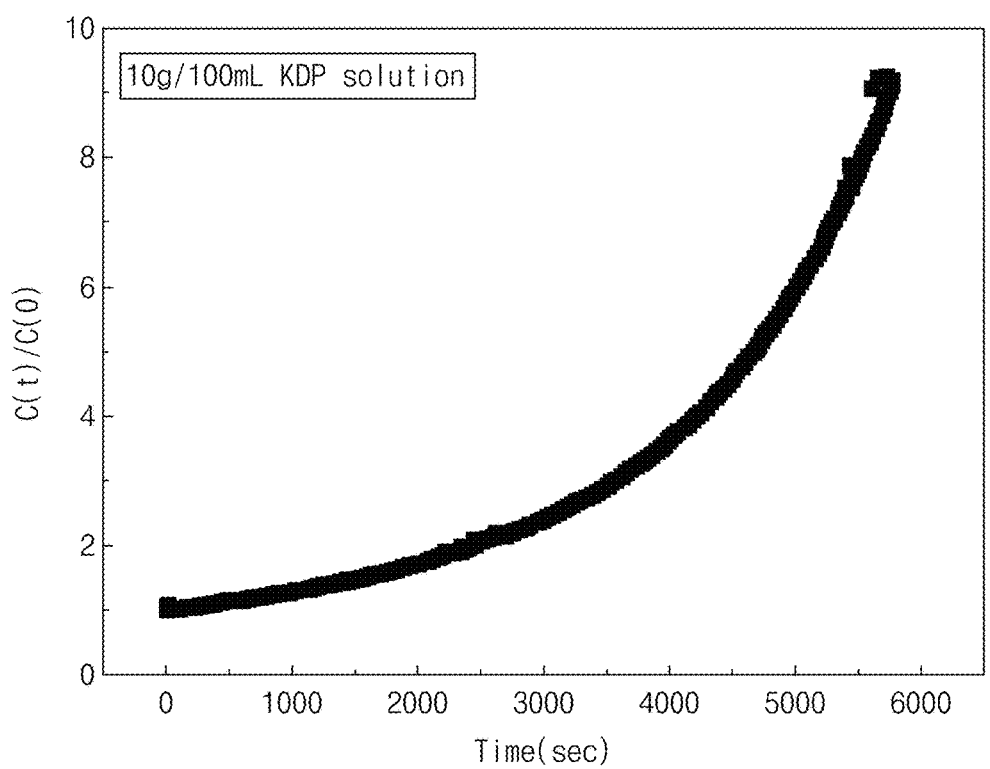
FIG. 10 is a graph showing the temporal variation in concentration of a KDP aqueous solution.

FIG. 10 is a graph showing the temporal variation in concentration of a KDP aqueous solution.

FIG. 10 shows variation in concentration of a levitated KDP aqueous solution over time, and a point of $C(t)/C(0)=1$ in FIG. 10 represents a saturated concentration. A relative concentration higher than one corresponds to a supersaturated state. A KDP aqueous solution containing 1000 liter water and 100 g KDP solute dissolved therein was prepared. $C(t)$ represents concentration, over time, of the KDP solute, and $C(0)$ represents an initial concentration of KDP solute.

As the water in the electrostatically-levitated KDP aqueous solution was evaporated, a normal concentration of the KDP aqueous solution varied over time. The KDP had a molecular mass of 136.09 g/mol. A saturated normal concentration, at which crystallization started, was 1 g/ml. A normal concentration of the saturated solution was maintained at a supersaturated state, without the crystallization, until it reached to about 3 g/ml.

FIG. 11 includes and provides images showing a growth of a single crystal in an aqueous solution KDP according to example embodiments of the inventive concept.

Referring to FIG. 11, images at left and right sides correspond to different angles. Black lines at lower portions of the images are scale bars representing a length of 1 mm. A single crystal KDP having a diameter of about 1 mm was obtained.

According to some embodiments of the inventive concept, a crystal growth apparatus may be used to grow a high-purity dielectric or protein single crystal of several hundred micrometers or larger, using an electrostatic levitation technique. In the crystal growth method, an aqueous solution is levitated in a non-contact manner, and thus, a crucible is not used for the crystal growth method. In the crystal growth method, a crystal may be formed through evaporation, without the use of any seed crystal.

According to some embodiments of the inventive concept, a crucible is not used in the crystal growth apparatus. Thus, it may be possible to prevent a heterogeneous nucleation site from being formed in a crystal growth process. Furthermore, by controlling temperature and humidity, it may be possible to increase a growth rate of a crystal.

According to some embodiments of the inventive concept, the use of the crystal growth apparatus may allow for a study on the mechanism of pure crystal growth.

According to some embodiments of the inventive concept, the crystal growth apparatus may allow a solution to be in a supercooled or supersaturated state. Thus, the crystal growth apparatus may be used to study a quasi-stable material. In the case where a crystal is grown by evaporating a solvent from an aqueous solution, a process of growing the crystal may be divided into a nucleation step, in which a crystal nucleus as a seed is formed, and a growth step, in which the crystal nucleus is grown. A low nucleation rate and high crystal growth rate are required for the growth of a single crystal. The nucleation rate and the crystal growth rate may depend on how much the solution is supercooled or supersaturated. The crystal growth apparatus may be configured to control temperature and humidity during the crystal growth process, and this may make it possible to control the supercooling or supersaturation level of the solution.

While example embodiments of the inventive concepts have been particularly shown and described, it will be understood by one of ordinary skill in the art that variations in form and detail may be made therein without departing from the spirit and scope of the attached claims.

What is claimed is:

1. An electrostatic levitation crystal growth apparatus, comprising:
    an upper electrode;
    a lower electrode vertically spaced apart from the upper electrode;
    a power supply unit configured to apply a vertical electrostatic field between the upper electrode and the lower electrode; and a droplet dispenser configured to eject a solution into a region between the upper and lower electrodes and thereby to form a solution droplet, wherein the solution droplet can be maintained in a charged state and electrostatically levitated against a gravity by the vertical electrostatic field, the solution droplet can be evaporated in the electrostatically levitated state, and a solute dissolved in the solution can be grown to form a crystal, wherein the droplet dispenser comprises a nozzle unit configured to eject a preliminary solution droplet, the nozzle unit comprising:

a needle providing a fluid passage, the needle being configured to eject the solution and to form the preliminary solution droplet; and a droplet cutting unit enclosing the needle and comprising an upper cover with a hole, wherein the hole is configured to be opened, when an end portion of the needle passes through the hole, and wherein the droplet cutting unit is configured to cut the ejected preliminary solution droplet and thereby to form a solution droplet, when the preliminary solution droplet is ejected from the needle that protrudes above the upper cover.

2. The apparatus of claim 1, wherein the solution droplet is charged with the same type of charges as that of the lower electrode, through a triboelectric charging with the droplet dispenser.

3. The apparatus of claim 1, wherein the solution droplet is electrostatically levitated in an air pressure.

4. The apparatus of claim 1, wherein the needle and the droplet cutting unit comprises a conductive material, wherein the conductive material is maintained at a same electric potential as the lower electrode, and wherein the conductive material is used to charge the preliminary solution droplet with positive charges.

5. The apparatus of claim 1, wherein the lower electrode is grounded, and the upper electrode is maintained at a negative voltage.

6. The apparatus of claim 1, wherein the upper cover of the droplet cutting unit is a cone-shaped structure, and the upper cover comprises a plurality of slits extending from an apex of the upper cover in a radial direction.

7. The apparatus of claim 1, wherein the nozzle unit is formed of or coated with a water-repellent or hydrophobic material.

8. The apparatus of claim 1, wherein the upper cover is formed of a stretchable or elastic material.

9. The apparatus of claim 1, wherein the droplet dispenser comprises:

a needle linear motion driving unit configured to allow for a vertical motion of the needle; and a droplet cutting linear motion driving unit configured to allow for a vertical motion of the droplet cutting unit.

10. The apparatus of claim 1, wherein an end portion of the nozzle unit of the droplet dispenser is positioned between the lower electrode and the upper electrode through a through-hole formed at a center of the lower electrode.

11. The apparatus of claim 1, further comprising:

a pair of first auxiliary electrodes configured to apply a first auxiliary electric field to a plane perpendicular to a center axis of the lower electrode and disposed to face each other with the solution droplet interposed therebetween;

a pair of second auxiliary electrodes configured to apply a second auxiliary electric field to a plane perpendicular to the center axis of the lower electrode and disposed to face each other with the solution droplet interposed therebetween;

a first auxiliary power configured to apply a first auxiliary voltage between the first auxiliary electrodes; and a second auxiliary power configured to apply a second auxiliary voltage between the second auxiliary electrodes, wherein the first auxiliary electric field is substantially orthogonal to the second auxiliary electric field.

12. The apparatus of claim 1, further comprising at least one of:

a vertical position measuring light source configured to irradiate light onto the levitated solution droplet;

a vertical position detection unit disposed to face the position measuring light source and configured to detect a position of the levitated solution droplet;

a crystallization-inducing probe configured to be in contact with the levitated solution droplet and induce formation of a crystal;

a sealing unit surrounding the levitated solution droplet and providing a sealed space;

a temperature control unit configured to circulate a fluid with a constant temperature along an internal side surface of the sealing unit; and a humidity control unit configured to provide moisture into the sealing unit or remove moisture from an internal space of the sealing unit.

13. The apparatus of claim 1, wherein the crystal is formed of $AH_2PO_4$ (A=K, NH4, Cs), $ABCl_3$ (A=Cs, K, Rb; B= Co, Cu, Zn, Cd, Mn), $LiASO_4$ (A=Cs, K), $CuSO_4.5H_2O$, $K_3Fe(CN)_6$, DKDP, $KDCO_3$, $NiSO_4.6H_2O$, $NaKC_4H_4O_6$ (potassium sodium tartrate, Rochelle Salt), $(NH_2CH_2COOH)_3.H_2SO_4$ (triglycine sulfate; TGS), $KD_2PO_4$ (deuterated potassium dihydrogen phosphate; DKDP), NaCl, protein crystal, or $KH_2PO_4$ (potassium dihydrogen phosphate; KDP).

* * * * *